(12) United States Patent
Wallisch et al.

(10) Patent No.: US 11,125,833 B1
(45) Date of Patent: Sep. 21, 2021

(54) METHOD FOR TESTING A DISCONNECTION POINT OF A PHOTOVOLTAIC INVERTER, AND A PHOTOVOLTAIC INVERTER OF THIS TYPE

(71) Applicant: Fronius International GmbH, Pettenbach (AT)

(72) Inventors: Gerhard Wallisch, Pettenbach (AT); Joachim Danmayr, Pettenbach (AT)

(73) Assignee: Fronius International GmbH, Pettenbach (AT)

( * ) Notice: Subject to any disclaimer, the term of this patent is extended or adjusted under 35 U.S.C. 154(b) by 0 days.

(21) Appl. No.: 17/274,245

(22) PCT Filed: Oct. 3, 2019

(86) PCT No.: PCT/EP2019/076788
§ 371 (c)(1),
(2) Date: Mar. 8, 2021

(87) PCT Pub. No.: WO2020/070234
PCT Pub. Date: Apr. 9, 2020

(30) Foreign Application Priority Data

Oct. 3, 2018 (EP) ..................... 18198509

(51) Int. Cl.
*G01R 31/02* (2006.01)
*G01R 31/327* (2006.01)
(Continued)

(52) U.S. Cl.
CPC .......... *G01R 31/42* (2013.01); *G01R 31/006* (2013.01); *G01R 31/327* (2013.01);
(Continued)

(58) Field of Classification Search
CPC .............. G01R 31/327; G01R 31/3277; G01R 31/3275; G01R 31/3278; G01R 31/3274;
(Continued)

(56) References Cited

U.S. PATENT DOCUMENTS 9,297,847 B2    3/2016   Oberzaucher et al.
9,494,659 B2   11/2016   Danmayr et al.
              (Continued)

FOREIGN PATENT DOCUMENTS

AT       513 866 B1   12/2015
CN     102565691 A     7/2012
              (Continued)

OTHER PUBLICATIONS

International Search Report in PCT/EP2019/076788, dated Dec. 4, 2019.
(Continued)

*Primary Examiner* — Raul J Rios Russo
(74) *Attorney, Agent, or Firm* — Collard & Roe, P.C.

(57) ABSTRACT

The invention relates to a method for testing a disconnection point (12) of a photovoltaic inverter (1) and to a photovoltaic inverter (1) of this type. According to the invention, in a testing mode, an auxiliary voltage (U_Lx) is applied between the input (E_Lx) of each line (Lx) of the disconnection point (12) and an intermediate circuit potential (M), in each case, the first switching contacts (SW_Lx,1) are closed and the second switching contacts (SW_Lx,2) are opened alternately and vice versa, according to a switching pattern, and, for each switching pattern, the voltages (U_Lx, GD; U_MN) between the output (A_Lx) of each line (Lx) of the disconnection point (12) and the intermediate circuit potential (M) are measured, and the functionality of each switching contact (SW_Lx,j) is derived from the measured voltages (U_Lx,GD; U_MN).

15 Claims, 5 Drawing Sheets

(51) Int. Cl.
  *G01R 31/42* (2006.01)
  *H02S 50/00* (2014.01)
  *H02S 40/32* (2014.01)
  *G01R 31/00* (2006.01)
  *H01H 47/00* (2006.01)
  *H01H 11/00* (2006.01)

(52) U.S. Cl.
  CPC ..... *G01R 31/3274* (2013.01); *G01R 31/3275* (2013.01); *G01R 31/3277* (2013.01); *G01R 31/3278* (2013.01); *H02S 40/32* (2014.12); *H02S 50/00* (2013.01); *H01H 11/0062* (2013.01); *H01H 47/002* (2013.01)

(58) Field of Classification Search
  CPC .... G01R 31/006; G01R 31/42; H01H 47/002; H01H 11/0062; H02S 40/32; H02S 50/00
  USPC .................................................. 324/415–424
  See application file for complete search history.

(56) References Cited

U.S. PATENT DOCUMENTS

| | | |
|---|---|---|
| 2011/0298470 A1 | 12/2011 | Gokhale et al. |
| 2014/0226365 A1* | 8/2014 | Oberzaucher ...... G01R 31/3278 363/13 |
| 2016/0099569 A1 | 4/2016 | Rilling et al. |
| 2016/0226256 A1* | 8/2016 | Falk ......................... H02H 7/20 |
| 2016/0268923 A1 | 9/2016 | Bremicker |
| 2019/0326832 A1* | 10/2019 | Luger ..................... H02J 9/062 |

FOREIGN PATENT DOCUMENTS

| | | |
|---|---|---|
| CN | 203981841 U | 12/2014 |
| CN | 104364869 A | 2/2015 |
| EP | 2 608 375 A2 | 6/2013 |
| EP | 2 837 012 B1 | 11/2015 |
| JP | 2004-187362 A | 7/2004 |

OTHER PUBLICATIONS

European Search Report in EP 18198509.4-1202, dated Mar. 25, 2019, with English translation of relevant parts.

International Preliminary Report on Patentability for International Application No. PCT/EP2019/076788 dated Mar. 23, 2021 in English.

Chinese Office Action in Chinese Application No. 201980059047.6 dated Jun. 23, 2021 with English translation.

* cited by examiner

METHOD FOR TESTING A DISCONNECTION POINT OF A PHOTOVOLTAIC INVERTER, AND A PHOTOVOLTAIC INVERTER OF THIS TYPE

CROSS REFERENCE TO RELATED APPLICATIONS

This application is the National Stage of PCT/EP2019/076788 filed on Oct. 3, 2019, which claims priority under 35 U.S.C. § 119 of European Application No. 18198509.4 filed on Oct. 3, 2018, the disclosure of which is incorporated by reference. The international application under PCT article 21(2) was not published in English.

BACKGROUND OF THE INVENTION

1. Field of the Invention

The invention relates to a method for testing a disconnection point of a photovoltaic inverter with an intermediate circuit, wherein the disconnection point has at least two lines each with two switching contacts in series in each line, which switching contacts are controlled accordingly for testing functionality.

The invention also relates to a photovoltaic inverter for converting a DC voltage into an AC voltage for feeding the AC voltage into a power supply grid and/or for supplying consumers, having an input DC-DC converter, an intermediate circuit, an output DC-AC converter and a disconnection point with at least two lines, each with two switching contacts in series in each line.

2. Description of the Related Art

Usually, an arrangement of one pair of relays per line is used as a disconnection point between the photovoltaic inverter and the supply grid or the consumers, in order to achieve a safe disconnection from the supply grid or the consumers. Compliance with the relevant standards and regulations is a prerequisite for approval for grid-parallel feed-in using inverters without galvanic isolation. For example, a disconnection point consisting of two independent devices for grid monitoring with assigned switches in series is prescribed. The functional integrity of the switching points must be checked to ensure that an intact double set of switching contacts is available before closing the relays and before starting a feed-in operation, and that all current-carrying conductors can still be disconnected if a single switching contact is sticking.

The documents EP 2 837 012 B1 and AT 513 866 B1 describe methods for testing a disconnection point of a photovoltaic inverter and a photovoltaic inverter of the type described by the present invention, wherein the switching contacts are switched in steps according to a specific switching pattern and the voltages before and after the disconnection point are measured and used to derive the functionality of the switching contacts.

The present invention is applicable to three-phase networks with three phases and one neutral conductor, single-phase networks with one phase and one neutral conductor, but also three-phase networks without neutral conductors or single-phase networks without neutral conductors, such as the American split-phase-grid or single-phase three-conductor grid.

SUMMARY OF THE INVENTION

The object of the present invention consists in the creation of an above-mentioned method for testing a disconnection point of a photovoltaic inverter and of a photovoltaic inverter of this type, which can be implemented simply and cost-effectively and with the minimum possible hardware outlay. The functionality of the disconnection point should be checked as quickly as possible and with little measurement effort. Disadvantages of known methods are to be avoided or at least reduced.

The object according to the invention is achieved in relation to the method by the fact that in a testing mode, an auxiliary voltage generated by the photovoltaic inverter is applied between the input of each line of the disconnection point and an intermediate circuit potential in each case, and alternately according to a switching pattern, the first switching contacts are closed and the second switching contacts are opened and thereafter the second switching contacts are closed and the first switching contacts are opened, and for each switching pattern of the switching contacts the voltages between the output of each line of the disconnection point and the intermediate circuit potential are measured, and from the measured voltages for each switching pattern of the switching contacts the functionality of each switching contact is derived. According to the invention, the testing of the disconnection point is performed in the testing mode using an auxiliary voltage generated by the photovoltaic inverter, in particular its output DC-AC converter, so that, unlike the prior art, the method is independent of the presence of a particular line voltage. This means that the test method according to the invention can also be used for stand-alone inverters and also for isolated networks and circuits, including emergency circuits, in which no voltage is present before switching on the photovoltaic inverter. The fact that the auxiliary voltage is generated with the existing hardware of the photovoltaic inverter means that the hardware outlay is particularly low, which means the method can be carried out very simply and cost-effectively. Essentially, the execution of the testing mode requires a certain sequence, which can be implemented relatively easily in software in an existing control device of the photovoltaic inverter or in a dedicated control device (e.g. a microprocessor). The voltage dropped across each switching contact can be calculated from the various voltages measured relative to the intermediate circuit potential and the calculated voltages can be used to determine the functionality of the switching contacts and thus the correct functioning of the disconnection point. In previous test procedures, the grid voltage was used for testing the switching contacts. The disadvantage here is that with functioning switching contacts, clock filter capacitors arranged in parallel with the supplied grid voltage, connect the line voltage to the intermediate circuit and a 50 Hz voltage is superimposed on the photovoltaic modules. This means that an unacceptably high current can flow through the intermediate circuit into the parasitic capacitance of the solar module and the fault current switch can be triggered. However, the present test method essentially generates no leakage currents that could trigger the fault current switch. Since different voltages are measured before and after the disconnection point in photovoltaic inverters for different control systems, these devices can also be used to perform the testing mode of the disconnection point. It is important that the supplied auxiliary voltages form circuits which allow a statement to be made about the voltage applied to each switching contact, in order to be able to determine whether a switching contact is incorrectly closed or is sticking. Auxiliary voltages are preferably provided by extra-low voltages, which typically means voltages below 25 V (AC).

Advantageously, alternately all the first switching contacts of the disconnection point are closed simultaneously and all the second switching contacts are opened and then all the second switching contacts are closed simultaneously and all the first switching contacts are opened. By simultaneously closing and opening the first and second switching contacts of all lines (phases and, if appropriate, neutral conductor) of the disconnection point, the test method can be carried out particularly quickly and easily with a single switching operation.

In a photovoltaic inverter for a three-phase supply network with three phases and a neutral conductor, three auxiliary voltages generated by the photovoltaic inverter are applied between the input of each phase of the disconnection point and the intermediate circuit potential and at least one auxiliary voltage is applied between the input of the neutral conductor of the disconnection point and the intermediate circuit potential via a coupling capacitor, and the voltages between the output of each phase and the output of the neutral conductor of the disconnection point and the voltage between the output of the neutral conductor of the disconnection point and the intermediate circuit potential, as well as at least one voltage between the input of a phase and the input of the neutral conductor of the disconnection point are measured, and from the measured voltages the functionality of each switching contact is derived for each switching pattern of the switching contacts. This represents a preferred method for carrying out the test method for a three-phase network with a neutral conductor. In the simplest case, three auxiliary voltages are applied to the input of the disconnection point, at least one auxiliary voltage being coupled into the neutral conductor via a coupling capacitor for testing the two switching contacts in the neutral conductor. In this case, during the testing mode, the input of the neutral conductor of the disconnection point is not connected to the intermediate circuit potential. By measuring the corresponding voltages at the output of the disconnection point, at the disconnection point and at least one voltage at the input of the disconnection point, the voltages at all switching contacts of the disconnection point can be derived or calculated and the functionality of the switching contacts of the disconnection point can be determined.

In a photovoltaic inverter for a single-phase supply network with one phase and a neutral conductor, two auxiliary voltages generated by the photovoltaic inverter are applied between the input of the phase of the disconnection point and the intermediate circuit potential and between the input of the neutral conductor of the disconnection point and the intermediate circuit potential, and the voltage between the output of the phase of the disconnection point and the output of the neutral conductor of the disconnection point and the voltage between the output of the neutral conductor of the disconnection point and the intermediate circuit potential are measured, and from the measured voltages the functionality of each switching contact is derived for each switching pattern of the switching contacts. This represents a preferred design variant for a single-phase network with neutral conductor, in which two auxiliary voltages are applied and only two voltages are measured at suitable points after the disconnection point and at the disconnection point, which means that the functionality of all four switching contacts of the disconnection point can be determined.

In a photovoltaic inverter for a single-phase supply network with two phases without a neutral conductor, a so-called split-phase-grid, two auxiliary voltages generated by the photovoltaic inverter are applied between the input of each phase of the disconnection point and the intermediate circuit potential, and the voltage between the outputs of the phases of the disconnection point and the voltage between the output of one phase of the disconnection point and the intermediate circuit potential are measured, and from the measured voltages for each switching pattern of the switching contacts the functionality of each switching contact is derived. This method is similar to the test procedure described above for a single-phase network with neutral conductor.

If the various voltages are measured simultaneously in the testing mode, the method can be performed very quickly and simply. Of course, in this case, several devices are required for measuring the voltages, which are usually present in photovoltaic inverters anyway. It is also possible to measure the voltages required to derive the functionality of the switching contacts sequentially with fewer devices for measuring the voltages between the conductors (phases and the neutral conductor, if appropriate).

The voltages measured in the testing mode can be measured over a plurality of periods, preferably 2 to 20 periods, and the measured values averaged. This averaging over a plurality of measurements can improve the signal-to-noise ratio. The averaging can be carried out in different ways, e.g. by forming a squared mean value (RMS, root mean square).

In the event of a malfunction of a switching contact of the disconnection point, an error message can be output. The error message can be transmitted remotely either acoustically, optically or via a user interface, in order to be able to quickly report a fault in the disconnection point to the user of the photovoltaic inverter in a suitable manner.

According to another feature of the invention, the current in each line is measured in the testing mode and a current limiter is activated if a specified limit value is exceeded. By activating such a current limiter, which is present in many photovoltaic inverters anyway, it is possible to prevent a situation where, if both series-connected switching contacts of one phase or the neutral conductor are unintentionally closed simultaneously, an excessive current flows which could lead to the destruction of circuit components.

A line filter can be arranged in front of the disconnection point. Such a line filter can prevent the transmission of impermissibly high frequencies to the supply network or to the consumers.

The object according to the invention is also achieved by means of a photovoltaic inverter as described above, wherein in a testing mode for testing the switching contacts of the disconnection point the output DC-AC converter is designed to generate auxiliary voltages, wherein the auxiliary voltages can be applied between the input of each line of the disconnection point and an intermediate circuit potential, a control device is designed in such a way that, alternately according to a switching pattern, the first switching contacts of the disconnection point are closed and the second switching contacts are opened and then the second switching contacts are closed and all the first switching contacts are opened, and that devices for measuring the voltages between the output of each line of the disconnection point and the intermediate circuit potential are provided, and an evaluation device is provided for deriving the functionality of each switching contact from the measured voltages for each switching pattern of the switching contacts. As already mentioned above, the photovoltaic inverter according to the invention is characterized by a particularly low hardware outlay. For details of further achievable advantages as a result, reference is made to the above description of the testing method.

For a three-phase supply network with three phases and a neutral conductor the output DC-AC converter of the photovoltaic inverter is designed to generate three auxiliary voltages, wherein the auxiliary voltages are applied between the input of each phase of the disconnection point and the intermediate circuit potential and at least one auxiliary voltage can be applied between the input of the neutral conductor of the disconnection point and the intermediate circuit potential via a coupling capacitor, and devices are provided for measuring the voltages between the output of each phase and the output of the neutral conductor of the disconnection point and one device is provided for measuring the voltage between the output of the neutral conductor of the disconnection point and the intermediate circuit potential, as well as at least one device for measuring the voltage between the input of a phase and the input of the neutral conductor of the disconnection point, and the evaluation device is designed to derive the functionality of each switching contact from the measured voltages for each switching pattern of the switching contacts.

If the at least one coupling capacitor is formed by the capacitor of a line filter, existing hardware can be used for the test device. A line filter arranged in front of the disconnection point can prevent the transmission of high-frequency signals and EMC (electromagnetic compatibility) regulations can be observed.

For a single-phase supply network with one phase and a neutral conductor the output DC-AC converter is designed to generate two auxiliary voltages, wherein the auxiliary voltages can be applied between the input of the phase of the disconnection point and the intermediate circuit potential and between the input of the neutral conductor of the disconnection point and the intermediate circuit potential, and a device is provided for measuring the voltages between the output of the phase and the output of the neutral conductor of the disconnection point, and a device is provided for measuring the voltage between the output of the neutral conductor of the disconnection point and the intermediate circuit potential, and the evaluation device is designed to derive the functionality of each switching contact from the measured voltages for each switching pattern of the switching contacts.

For a single-phase supply network with two phases without a neutral conductor, the output DC-AC converter is designed to generate two auxiliary voltages, wherein the auxiliary voltages can be applied between the inputs of the phases of the disconnection point and the intermediate circuit potential, and a device is provided for measuring the voltage between the outputs of the phases of the disconnection point and a device is provided for measuring the voltage between the output of a phase of the disconnection point and the intermediate circuit potential, and the evaluation device is designed for deriving the functionality of each switching contact from the measured voltages for each switching pattern of the switching contacts.

If a device is provided for buffering and averaging the measured voltages before and after the disconnection point over several periods, preferably 2 to 20, the signal-to-noise ratio can be improved.

If a warning device is provided for outputting an error message if a malfunction is detected in a switching contact of the disconnection point, the operator of the photovoltaic inverter can be quickly and easily informed of the malfunction of the disconnection point.

Preferably, a device is provided for limiting the current through each phase in the testing mode. As already stated above in connection with the test method, a current limitation can be achieved in the event of unintentional simultaneous closing of both switching contacts connected in series.

The first switching contacts of all lines can be formed by at least one multi-pole relay and the second switching contacts of all lines can be formed by at least one further multi-pole relay. The switching contacts can thus be formed by double relays or multi-pole relays. In the simplest case, all of the first switching contacts are formed by a multi-pole relay and all the second switching contacts by a further multi-pole relay, which means that only two relays are required for implementing the disconnection point.

BRIEF DESCRIPTION OF THE DRAWINGS

The present invention will be explained in further detail by reference to the attached drawings. Shown are.

DETAILED DESCRIPTION OF THE PREFERRED EMBODIMENTS

Figure 1:
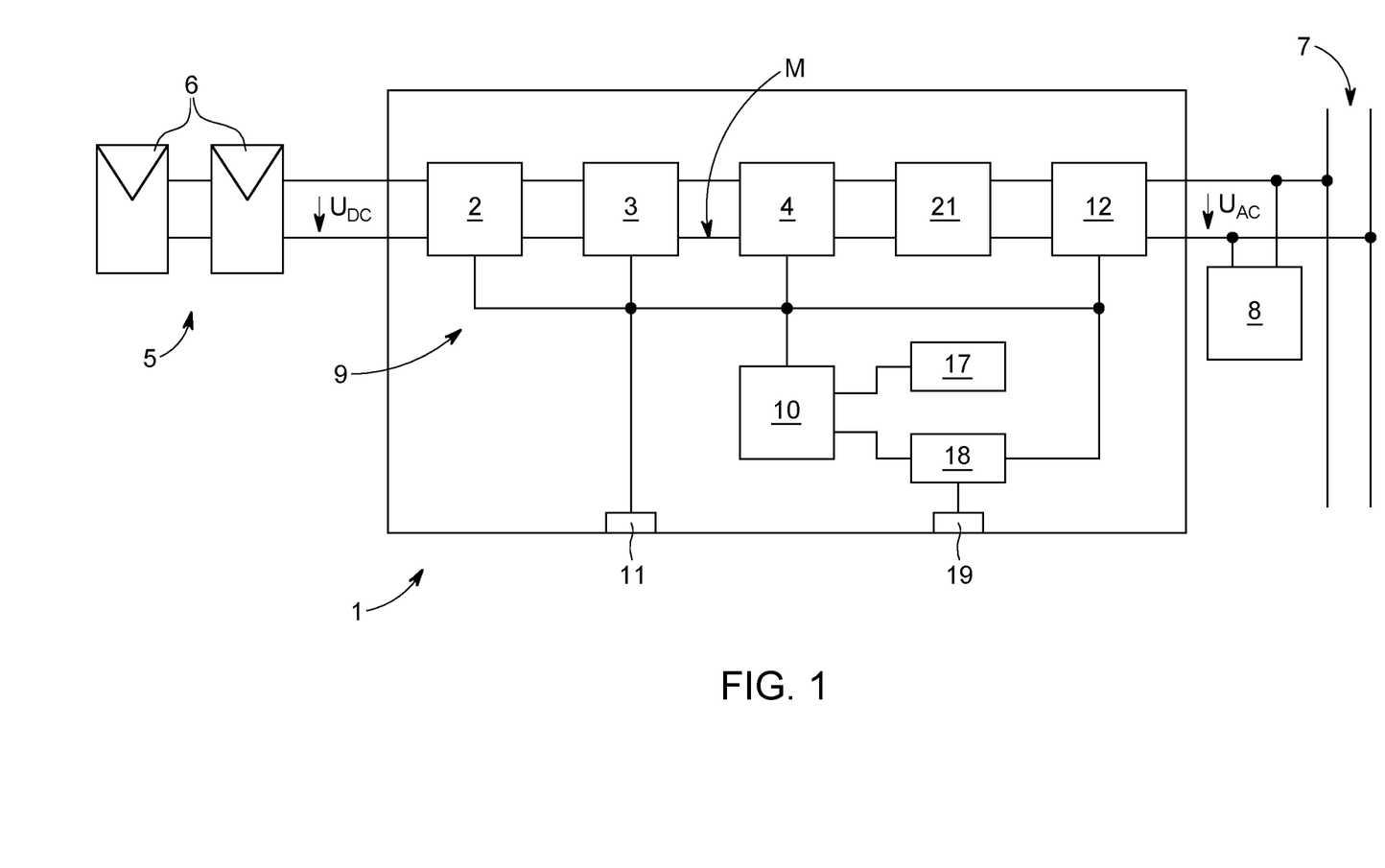
FIG. 1 a schematic block circuit diagram of a photovoltaic inverter.

FIG. 1 shows a structure of a photovoltaic inverter 1, specifically an RF inverter. The photovoltaic inverter 1 has at least one input DC-DC converter 2, an intermediate circuit 3, and an output DC-AC converter 4. An energy source 5 is connected to the input DC-DC converter 2, which is preferably formed by one or more solar modules 6 connected in parallel and/or in series. The photovoltaic inverter 1 and the solar modules 6 are also referred to as a photovoltaic system or a PV system. The output of the photovoltaic inverter 1 or the output DC-AC converter 4 can be connected to a supply network 7, such as a public or private AC power supply network or a multiphase network, and/or to at least one electrical consumer 8, which represents a load. For example, a consumer 8 is formed by a motor, a refrigerator, a radio set, etc. Likewise, the consumer 8 can also be a domestic supply.

A photovoltaic inverter 1 of this type is preferably used as a so-called grid-connected photovoltaic inverter 1, the energy management of which is optimized to feed as much energy as possible into the supply network 7. As an alternative, the photovoltaic inverter 1 can also be used exclusively to supply consumers 8. In this case, the term used is a so-called stand-alone inverter.

The individual components of the photovoltaic inverter 1, such as the input DC-DC converter 2, can be connected to a control device 10 via a data bus 9. The control device 10 of the photovoltaic inverter 1 is formed by a microprocessor, microcontroller or computer, for example. The control device 10 can be used to perform an appropriate control of the individual components of the photovoltaic inverter 1, such as the input DC-DC converter 2 or the output DC-AC converter 4, in particular, the switching elements arranged therein. For this purpose, the individual open-loop or closed-loop control sequences are stored in the control device 10 by means of appropriate software programs and/or data or characteristic curves.

Furthermore, via the data bus 9, operating elements 11 can be connected to the control device 10, by means of which the user can, for example, configure the photovoltaic inverter 1 and/or display and set operating states or parameters (e.g. by means of LEDs). These operating elements 11 are connected to the control device 10, for example, via the data bus 9 or directly. Such operating elements 11 are arranged, for example, on the front of the photovoltaic inverter 1, so that external operation is possible. The operating elements 11 can also be arranged directly on assemblies and/or modules within the photovoltaic inverter 1.

In particular when using a photovoltaic inverter 1 for feeding into a supply network 7, standards require a disconnection point 12 to be connected between the photovoltaic inverter 1 and the supply network 7. This disconnection point 12 must be checked for correct functioning before connecting the photovoltaic inverter 1 into the supply network 7 or to the consumer 8. For this purpose, in a testing mode auxiliary voltages are applied to the lines of the disconnection point 12 via a control device, which can be formed by the existing control device 10 of the photovoltaic inverter 1, the switching contacts of the disconnection point 12 are activated according to a switching pattern and various voltages are applied to the output of disconnection point 12, measured at the disconnection point 12 and ideally at the input of the disconnection point 12, from which the individual voltages at the individual switching contacts of the disconnection point 12 can be calculated for each switching pattern and the proper functioning of all switching contacts can thus be determined. The voltages are measured relative to an intermediate circuit potential M of the intermediate circuit 3. For measuring the voltages, already existing devices for voltage measurement are preferably used. In an evaluation device 17 connected to the control device 10, the voltages on the individual switching contacts are determined and the functionality of the switching contacts is deduced. A device 18 is used for buffering and possible averaging of the measured voltages over several periods. A warning device 19 can be used to issue a warning to a user or operator of the photovoltaic system in various ways, for example acoustically, optically or the like.

A line filter 21 can be arranged between the output DC-AC converter 4 and the disconnection point 12, which prevents the transmission of impermissibly high frequencies to the supply network 7 or the consumers 8 via the output AC voltage UAC.

Figure 2:
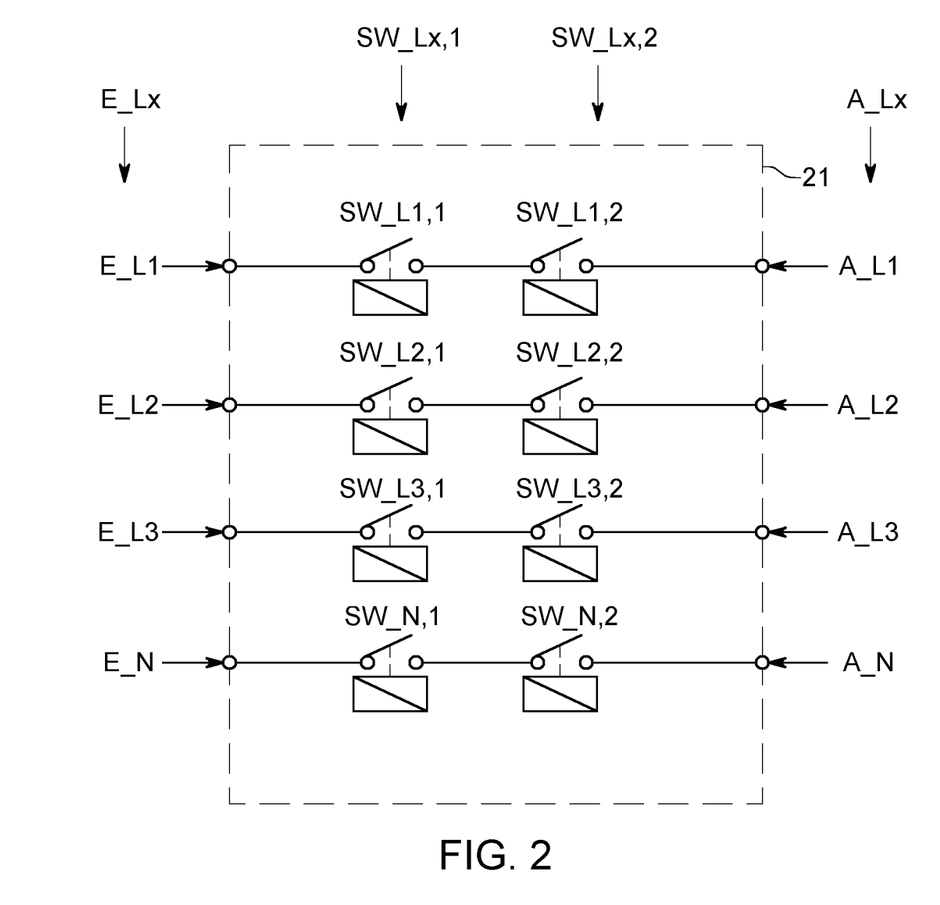
FIG. 2 the structure of a disconnection point between a photovoltaic inverter and a supply network or consumer in a three-phase network.

FIG. 2 shows the structure of a disconnection point 12 for four lines Lx, preferably for a three-phase network with three phases L1, L2, L3 and a neutral conductor N. Two switching contacts SW_Lx,1 and SW_Lx,2 are arranged in series in each line Lx. All line Lx of the disconnection point 12 have inputs E_Lx, in the example shown the inputs E_Li of the phases Li and the input E_N of the neutral conductor N as well as outputs A_Lx, here specifically the outputs A_Li of phases Li and the output A_N of the neutral conductor N. In the testing mode for testing the function of the switching contacts SW_Lx,j, auxiliary voltages U_Lx are applied to the inputs E_Lx of the disconnection point 12 and, alternately in accordance with a switching pattern, the first switching contacts SW_Lx,1 of the disconnection point 12 are closed and the second switching contacts SW_Lx,2 are opened in each case and then the second switching contacts SW_Lx,2 are closed and the first switching contacts SW_Lx,1 are opened in each case. For each switching pattern of the switching contacts SW_Lx,j, voltages are measured between the output A_Lx of each line Lx of the disconnection point 12 and the intermediate circuit potential M of the photovoltaic inverter 1. These measured voltages for each switching pattern of the switching contacts SW_Lx,j are used to derive the functionality of each switching contact SW_Lx,j.

Figure 3:
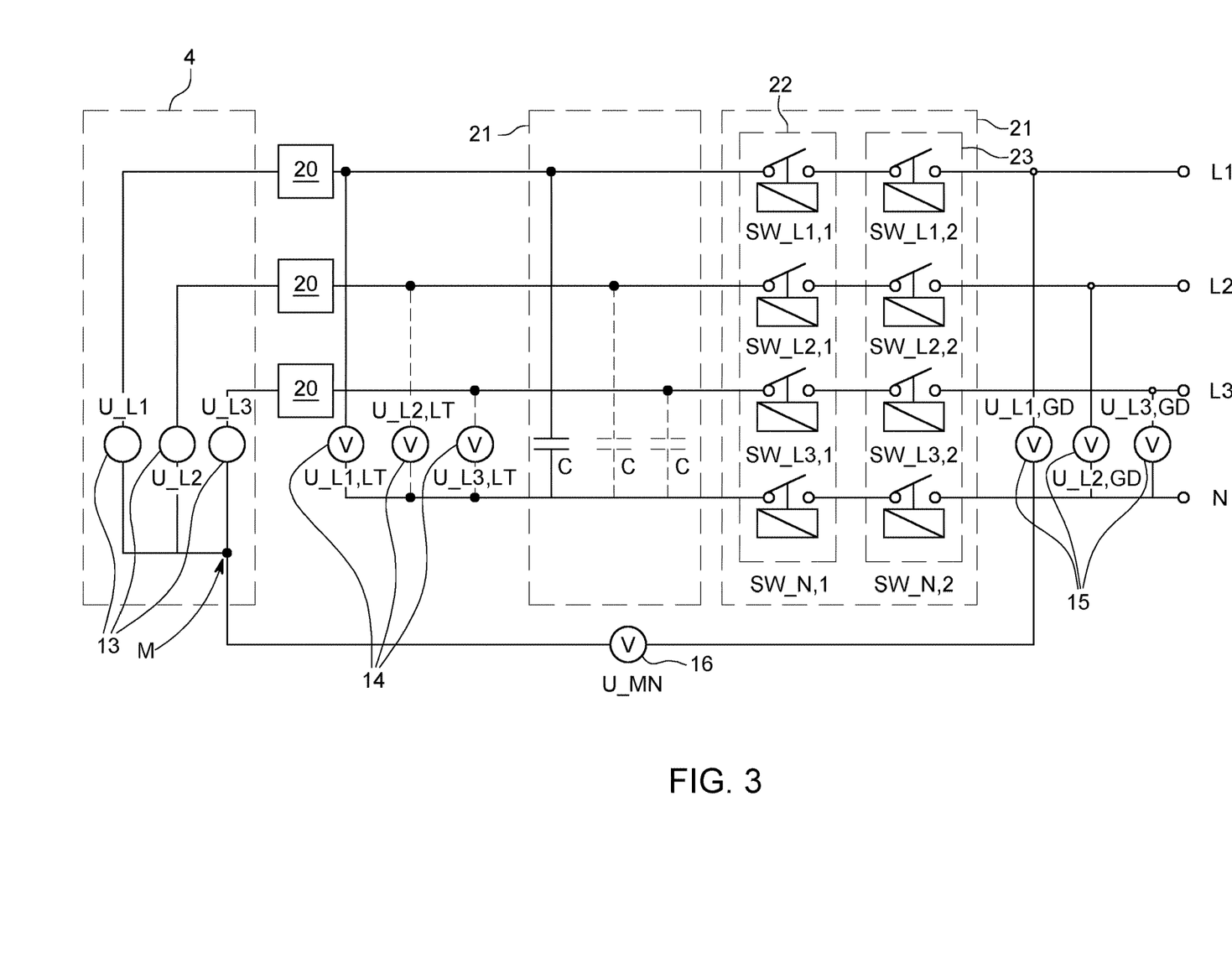
FIG. 3 the schematic structure of a disconnection point between a photovoltaic inverter and a three-phase supply network with neutral conductor, using the method according to the invention for testing the disconnection point.

FIG. 3 shows the structure of a disconnection point 12 between a photovoltaic inverter 1 and a supply network 7 or consumer 8 in a three-phase network with three phases L1, L2 and L3 and a neutral conductor, using the method according to the invention for testing the disconnection point 12. According to the invention, auxiliary voltages U_Li are generated by corresponding devices 13, and in the testing mode for testing the switching contacts SW_Li,j and SW_N,j are injected between the input E_L1, E_L2, E_L3 of each phase L1, L2, L3 of the disconnection point 12 and the intermediate circuit potential M. To test the switching contacts SW_N,1 and SW_N,2 in the neutral conductor N, an auxiliary voltage U_L1 is injected via a coupling capacitor C between the input E_N of the neutral conductor N of the disconnection point 12 and the intermediate circuit potential M. Devices 15 are used to measure the voltages U_L1,GD; U_L2,GD; U_L3,GD between the output A_L1; A_L2; A_L3 of each phase L1; L2; L3 of the disconnection point 12 and the output A_N of the neutral conductor N of the disconnection point 12. Via a device 16, the voltage U_MN between the output A_N of the neutral conductor N of the disconnection point 12 and the intermediate circuit potential M is detected. Finally, at the input of the disconnection point 12 at least one device 14 is provided for measuring the voltage U_L1,LT between input E_L1 of phase L1 and the input E_N of the neutral conductor N of the disconnection point 12. In the evaluation unit 17 (see FIG. 1), the voltages are calculated at all switching contacts SW_Li,j and SW_N,j to derive the functionality of each switching contact SW_Li,j and SW_N,j from the measured voltages in each switching pattern of the switching contacts SW_Li,j and SW_N,j. It is crucial that sufficient measurement information is available to determine the voltages dropped across the switching contacts in order to be able to determine their functionality. Assuming that all first switching contacts SW_Li,1 and SW_N,1 and then all second switching contacts SW_Li,2 and SW_N,2 are switched simultaneously, the testing of the disconnection point 12 can be carried out with a single switching operation during the testing mode. If the voltage difference at the switching contact is virtually zero, this is an indication that the switching contact is sticking, i.e. not functioning properly. If the voltage difference at a switching contact is essentially equal to the injected auxiliary voltage U_Li, U_N, the corresponding switching contact SW_Li,j or SW_N,j is functioning.

The following table shows the switching pattern for testing the switching contacts SW_Li,j; SW_N,j of the disconnection point 12 according to FIG. 3. The total of eight switching contacts are activated according to a switching pattern which contains two switching states 1 and 2, and the corresponding voltages are measured for each switching state 1 or 2, so that the differential voltages at all switching contacts SW_Lx,j can be calculated and thus any sticking of the switching contacts SW_Lx,j can be determined.

| Switching contact | Switch state | |
|---|---|---|
| | 1 | 2 |
| SW_L1, 1 | closed | open |
| SW_L1, 2 | open | closed |
| SW_L2, 1 | closed | open |
| SW_L2, 2 | open | closed |
| SW_L3, 1 | closed | open |
| SW_L3, 2 | open | closed |
| SW_N, 1 | closed | open |
| SW_N, 2 | open | closed |

For example, the voltages at the individual switching contacts SW_Li,j and SW_N,j are calculated as follows:

The voltages U_Li,LT are not required for measuring the voltages at the switching contacts SW_Li,j of the phases Li.

1.) Calculation of the Relay Voltage of Phase L1:
U_L1−SW_L1, 1−SW_L1, 2−U_L1, GD+U_MN=0 or
SW_L1, 1+SW_L1, 2=U_L1−U_L1, GD+U_MN 2.) Calculation of the Relay Voltage of Phase L2:
U_L2−SW_L2,1−SW_L2,2−U_L2,GD+U_MN=0 or
SW_L2,1+SW_L2,2=U_L2−U_L2,GD+U_MN 3.) Calculation of the Relay Voltage of Phase L3:
U_L3−SW_L3,1−SW_L3,2−U_L3,GD+U_MN=0 or
SW_L3,1+SW_L3,2=U_L3−U_L3,GD+U_MN 4.) Calculation of the Relay Voltage of the Neutral Conductor n (3 Possibilities):

The voltages U_Li,GD after the disconnection point 12 are not required for measuring the voltages at the switching contacts SW_N,j of the neutral conductor N.

U_L1−U_L1, LT−SW_N, 1−SW_N, 2+U_MN=0 or
SW_N, 1+SW_N, 2=U_L1−U_L1, LT+U_MN
U_L2−U_L2,LT−SW_N,1−SW_N,2+U_MN=0 or
SW_N,1+SW_N,2=U_L2−U_L2, LT+U_MN
U_L3−U_L3, LT−SW_N, 1−SW_N, 2+U_MN=0 or
SW_N, 1+SW_N, 2=U_L3−U_L3, LT+U_MN

Figure 4:
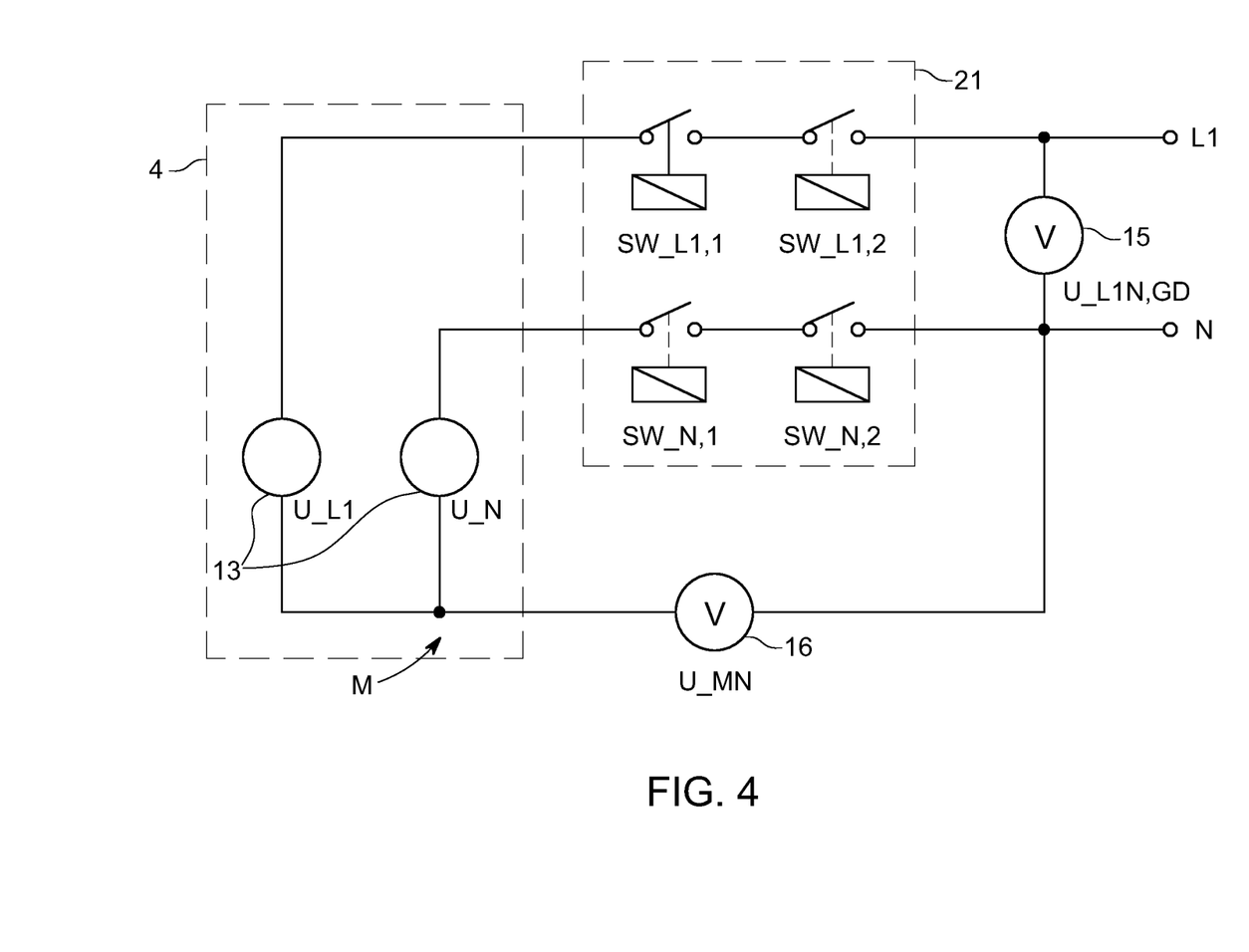
FIG. 4 the schematic structure of a disconnection point between a photovoltaic inverter and a single-phase supply network with neutral conductor, using the method according to the invention for testing the disconnection point.

FIG. 4 shows the structure of a disconnection point 12 between a photovoltaic inverter 1 and a supply network 7 or consumer 8 in a single-phase network with one phase L1 and a neutral conductor N, using the method according to the invention for testing the disconnection point 12. In this case, two auxiliary voltages U_L1 and U_N are generated by the photovoltaic inverter 1, in particular by the output DC-AC converter 4, and injected between the input E_L1 of phase L1 of the disconnection point 12 and the intermediate circuit potential M and between the input E_N of the neutral conductor N of the disconnection point 12 and the intermediate circuit potential M. Using a device 15, the voltage U_L1N,GD is measured between the output A_L1 of phase L1 and the output A_N of the neutral conductor N of the disconnection point 12. Using the device 16, the voltage U_MN between the output A_N of the neutral conductor N of the disconnection point 12 and the intermediate circuit potential M is detected. Via the evaluation unit 17 the differential voltages at the switching contacts SW_L1,j and SW_N,j are calculated, from which their functionality can be derived. In this case, the switching pattern is preferably as follows:

| Switching contact | Switch state | |
|---|---|---|
| | 1 | 2 |
| SW_L1, 1 | closed | open |
| SW_L1, 2 | open | closed |
| SW_N, 1 | closed | open |
| SW_N, 2 | open | closed |

Figure 5:
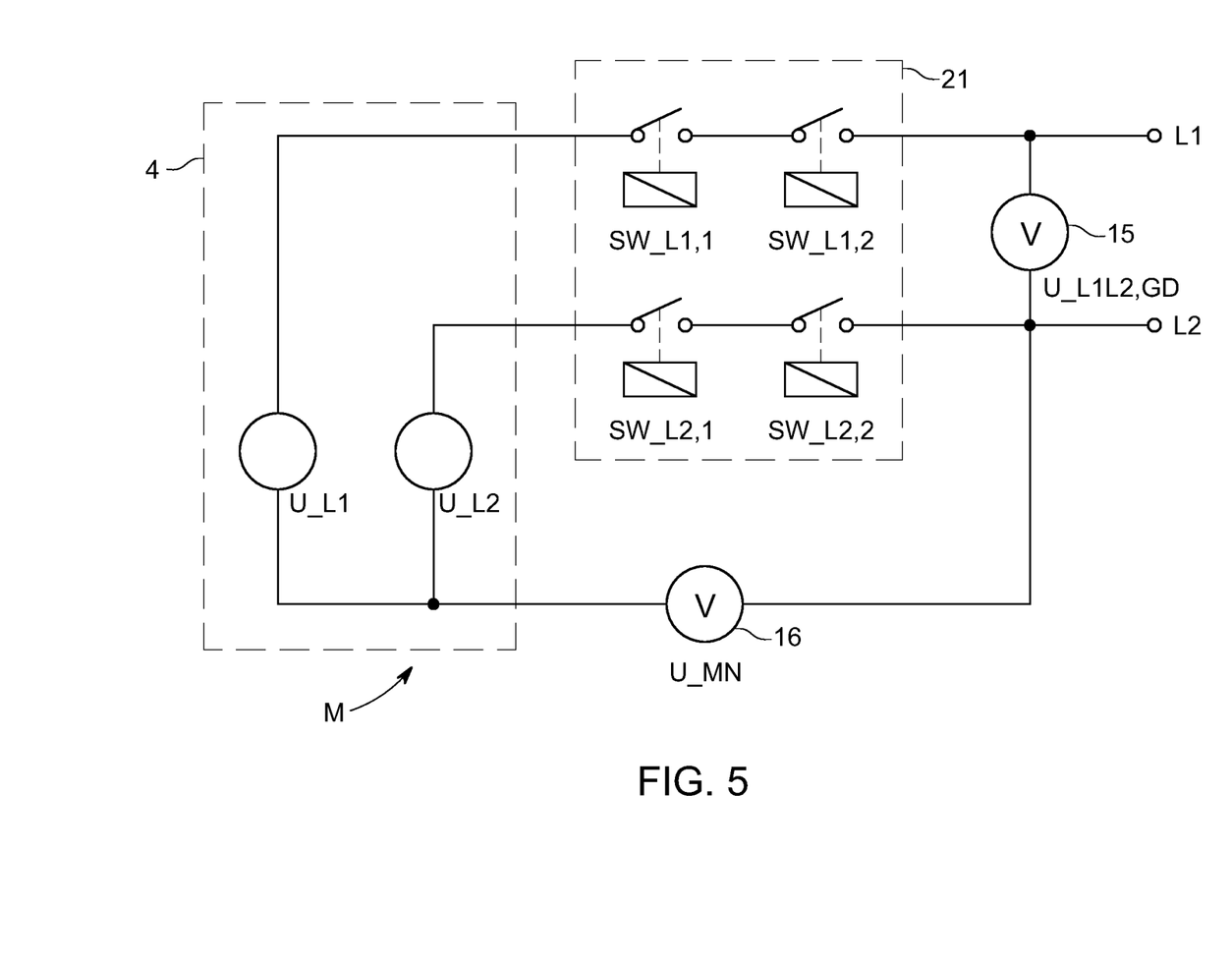
FIG. 5 the schematic structure of a disconnection point between a photovoltaic inverter and a single-phase supply network without neutral conductor, using the method according to the invention for testing the disconnection point.

1.) Calculation of the Relay Voltage on Phase L1:
U_L1−SW_L1,1−SW_L1,2+U_L1N,GD—U_MN=0 or
SW_L1,1+SW_L1,2=U_L1+U_L1N,GD—U_MN 2.) Calculation of the Relay Voltage on the Neutral Conductor N:
U_L1N,GD is not required for this.
U_N−SW_N, 1−SW_N, 2−U_MN=0 or
SW_N, 1+SW_N, 2=U_N−U_MN FIG. 5 shows the structure of a disconnection point 12 between a photovoltaic inverter 1 and a supply network 7 or consumer 8 in a single-phase network with two phases L1 and L2 and with no neutral conductor N, using the method according to the invention for testing the disconnection point 12. In this case, two auxiliary voltages U_L1 and U_L2 are generated by the photovoltaic inverter 1, in particular by the output DC-AC converter 4, and injected between the inputs E_L1 and E_L2 of the phases L1 and L2 of the disconnection point 12 and the intermediate circuit potential M. Using a device 15, the voltage U_L1 L2,GD is measured between the output A_L1 of phase L1 and the output A_L2 of phase L2 of the disconnection point 12. Using the device 16, the voltage U_MN between the output A_L2 of the phase L2 of the disconnection point 12 and the intermediate circuit potential M is detected. Via the evaluation unit 17 the differential voltages at the switching contacts SW_L1,j and SW_L2, j are calculated, from which their functionality can be derived. In this case, the switching pattern is preferably as follows:

| Switching contact | Switch state | |
|---|---|---|
| | 1 | 2 |
| SW_L1, 1 | closed | open |
| SW_L1, 2 | open | closed |
| SW_L2, 1 | closed | open |
| SW_L2, 2 | open | closed |

1.) Calculation of the Relay Voltage on Phase L1:
U_L1−SW_L1,1−SW_L1,2+U_L1L2,GD—U_MN=0 or
SW_L1,1+SW_L1,2=U_L1+U_L1L2,GD—U_MN 2.) Calculation of the Relay Voltage on Phase L2:
U_L1L2,GD is not required for this.
U_L2−SW_L2,1−SW_L2,2−U_MN=0 or
SW_L2,1+SW_L2,2=U_L2−U_MN Of course, other arrangements of the voltage measuring devices are also conceivable, wherein it must be ensured that a corresponding number of voltages are always measured, so that the voltages at the individual switching contacts of the disconnection point 12 can be calculated uniquely.

The invention claimed is:

1. A method for testing a disconnection point (12) of a photovoltaic inverter (1) having an intermediate circuit (3), wherein the disconnection point (12) has at least two lines (Lx) each having two switching contacts (SW_Lx,j) in series in each line (Lx), which switching contacts (SW_Lx,j) are controlled accordingly for testing functionality, wherein in a testing mode, an auxiliary voltage (U_Lx) generated by the photovoltaic inverter (1) is applied between the input (E_Lx) of each line (Lx) of the disconnection point (12) and an intermediate circuit potential (M) in each case, alternately according to a switching pattern the first switching contacts (SW_Lx,1) of the disconnection point (12) are closed and the second switching contacts (SW_Lx,2) are opened and then the second switching contacts (SW_Lx,2) are closed and the first switching contacts (SW_Lx,1) are opened and, for each switching pattern of the switching contacts (SW_Lx,j), measured voltages (U_Lx,GD; U_MN) between the output (A_Lx) of each line (Lx) disconnection point (12) and the intermediate circuit potential (M) are measured, and from the measured voltages (U_Lx,GD; U_MN) for each switching pattern of the switching contacts (SW_Lx,j) the functionality of each switching contact (SW_Lx,j) is derived.

2. The method according to claim 1, wherein alternately, all the first switching contacts (SW_Lx,1) of the disconnection point (12) are closed simultaneously and all the second switching contacts (SW_Lx,2) are opened and then all the second switching contacts (SW_Lx,2) are closed simultaneously and all the first switching contacts (SW_Lx,1) are opened.

3. The method according to claim 1, wherein in a photovoltaic inverter (1) for a three-phase supply network (7) with three phases (L1, L2, L3) and a neutral conductor (N), three auxiliary voltages (U_L1, U_L2, U_L3) generated by the photovoltaic inverter (1) are applied between the input (E_L1, E_L2, E_L3) of each phase (L1, L2, L3) of the disconnection point (12) and the intermediate circuit potential (M) and at least one auxiliary voltage (U_L1) is applied between the input (E_N) of the neutral conductor (N) of the disconnection point (12) and the intermediate circuit potential (M) via a coupling capacitor (C), and the voltages (U_L1,GD, U_L2,GD, U_L3,GD) between the output (A_L1, A_L2, A_L3) of each phase (L1, L2, L3) and the output (A_N) of the neutral conductor (N) of the disconnection point (12) and the voltage (U_MN) between the output (A_N) of the neutral conductor (N) of the disconnection point (12) and the intermediate circuit potential (M) as well as at least one voltage (U_Li,LT) between the input (E_Li) of a phase (Li) and the input (E_N) of the neutral conductor (N) of the disconnection point (12) are measured, and from the measured voltages (U_L1,GD, U_L2,GD, U_L3,GD, U_MN, U_Li,LT) for each switching pattern of the switching contacts (SW_Li,j; SW_N,j) the functionality of each switching contact (SW_Li,j; SW_N,j) is derived.

4. The method according to claim 1, wherein in a photovoltaic inverter (1) for a single-phase supply network (7) with one phase (L1) and a neutral conductor (N), two auxiliary voltages (U_L1, U_N) generated by the photovoltaic inverter (1) are applied between the input (E_L1) of the phase (L1) of the disconnection point (12) and the intermediate circuit potential (M) and between the input (E_N) of the neutral conductor (N) of the disconnection point (12) and the intermediate circuit potential (M), and the voltage (U_L1N,GD) between the output (A_L1) of the phase (L1) of the disconnection point (12) and the output (A_N) of the neutral conductor (N) of the disconnection point (12) and the voltage (U_MN) between the output (A_N) of the neutral conductor (N) of the disconnection point (12) and the intermediate circuit potential (M) are measured, and from the measured voltages (U_L1N,GD; U_MN) for each switching pattern of the switching contacts (SW_Li,j; SW_N,j) the functionality of each switching contact (SW_Li,j; SW_N,j) is derived.

5. The method according to claim 1, wherein in a photovoltaic inverter (1) for a single-phase supply network (7) with two phases (L1, L2), two auxiliary voltages (U_L1, U_L2) generated by the photovoltaic inverter (1) are applied between the input (E_L1, E_L2) of each phase (L1, L2) of the disconnection point (12) and the intermediate circuit potential (M), and the voltage (U_L1 L2,GD) between the outputs (A_L1, A_L2) of the phases (L1, L2) of the disconnection point (12) and the voltage (U_MN) between the output (A_L2) of one phase (L2) of the disconnection point (12) and the intermediate circuit potential (M) are measured, and from the measured voltages (U_L1L2,GD; U_MN) for each switching pattern of the switching contacts (SW_Li,j) the functionality of each switching contact (SW_Li,j) is derived.

6. The method according to claim 1, wherein the voltages (U_Lx,LT; U_Lx,GD; U_MN) measured in the testing mode are measured over a plurality of periods, preferably 2 to 20 periods, and the measured values are averaged.

7. The method according to claim 1, wherein in the testing mode, the current (I_Lx) in each line (Lx) is measured and a current limiter is activated when a specified limit value (I_Lx,g) is exceeded.

8. A photovoltaic inverter (1) for converting a DC voltage ($U_{DC}$) into an AC voltage ($U_{AC}$) for feeding the AC voltage ($U_{AC}$) into a power supply grid (7) and/or for supplying consumers (8), having an input DC-DC converter (2), an intermediate circuit (3), an output DC-AC converter (4) and a disconnection point (12) with at least two lines (Lx), each with two switching contacts (SW_Lx,j) in series in each line (Lx), wherein in a testing mode for testing the switching contacts (SW_Lx,j) of the disconnection point (12) the output DC-AC converter (4) is designed to generate auxiliary voltages (U_Lx), wherein the auxiliary voltages (U_Lx) can be applied between the input (E_Lx) of each line (Lx) of the disconnection point (12) and an intermediate circuit potential (M), a control device (10) is designed in such a way that, alternately according to a switching pattern, the first switching contacts (SW_Lx,1) of the disconnection point (12) are closed and the second switching contacts (SW_Lx, 2) are opened and then the second switching contacts (SW_Lx,2) are closed and all the first switching contacts (SW_Lx,1) are opened, and wherein devices (15) for measuring the voltages (U_Lx,GD; U_MN) between the output (A_Lx) of each line (Lx) of the disconnection point (12) and the intermediate circuit potential (M) are provided, and an evaluation device (17) is provided for deriving the functionality of each switching contact (SW_Lx,j) from the measured voltages (U_Lx,LT; U_Lx,GD; U_MN) for each switching pattern of the switching contacts (SW_Lx,j).

9. The photovoltaic inverter (1) according to claim 8, wherein for a three-phase supply network (7) with three phases (L1, L2, L3) and a neutral conductor (N) the output DC-AC converter (4) is designed to generate three auxiliary voltages (U_L1, U_L2, U_L3), wherein the auxiliary voltages (U_Li) are applied between the input (E_L1; E_L2; E_L3) of each phase (L1; L2; L3) of the disconnection point (12) and the intermediate circuit potential (M) and at least one auxiliary voltage (U_L1) can be applied between the input (E_N) of the neutral conductor (N) of the disconnection point (12) and the intermediate circuit potential (M) via a coupling capacitor (C), and wherein devices (15) are provided for measuring the voltages (U_L1,GD; U_L2,GD; U_L3,GD) between the output (A_L1; A_L2; A_L3) of each phase (L1; L2; L3) of the disconnection point (12) and the output (A_N) of the neutral conductor (N) of the disconnection point (12), a device (16) for measuring the voltage (U_MN) between the output (A_N) of the neutral conductor (N) of the disconnection point (12) and the intermediate circuit potential (M) is provided as well as at least one device (14) for measuring the voltage (U_Li,LT) between the input (E_Li) of a phase (Li) and the input (E_N) of the neutral conductor (N) of the disconnection point (12), and wherein the evaluation device (17) is designed to derive the functionality of each switching contact (SW_Li,j; SW_N,j) from the measured voltages (U_L1,GD; U_L2,GD; U_L3, GD; U_MN; U_L1,LT) for each switching pattern of the switching contacts (SW_Li,j; SW_N,j).

10. The photovoltaic inverter (1) according to claim 9, wherein the at least one coupling capacitor (C) is formed by the capacitor (C) of a line filter (21).

11. The photovoltaic inverter (1) according to claim 8, wherein for a single-phase supply network (7) with a phase (L1) and a neutral conductor (N) the output DC-AC converter (4) is designed to generate two auxiliary voltages (U_L1, U_N), wherein the auxiliary voltages (U_L1, U_N) can be applied between the input (E_L1) of the phase (L1) of the disconnection point (12) and the intermediate circuit potential (M) and between the input (E_N) of the neutral conductor (N) of the disconnection point (12) and the intermediate circuit potential (M), and wherein a device (15) is provided for measuring the voltages (U_L1N,GD) between the output (A_L1) of the phase (L1) and the output (A_N) of the neutral conductor (N) of the disconnection point (12), and a device (16) is provided for measuring the voltage (U_MN) between the output (A_N) of the neutral conductor (N) of the disconnection point (12) and the intermediate circuit potential (M), and wherein the evaluation device (17) is designed to derive the functionality of each switching contact (SW_Li,j; SW_N,j) from the measured voltages (U_L1N,GD; U_MN) for each switching pattern of the switching contacts (SW_Li,j; SW_N,j).

12. The photovoltaic inverter (1) according to claim 8, wherein for a single-phase supply network (7) with two phases (L1, L2), of the output DC-AC converter (4) is designed to generate two auxiliary voltages (U_L1, U_L2), wherein the auxiliary voltages (U_L1, U_L2) can be applied between the inputs (E_L1, E_L2) of the phases (L1, L2) of the disconnection point (12) and the intermediate circuit potential (M), and wherein a device (15) is provided for measuring the voltage (U_L1 L2,GD) between the outputs (A_L1, A_L2) of the phases (L1, L2) of the disconnection point (12) and a device (16) is provided for measuring the voltage (U_MN) between the output (A_L2) of a phase (L2) of the disconnection point (12) and the intermediate circuit potential (M), and wherein the evaluation device (17) is designed for deriving the functionality of each switching contact (SW_Li,j; SW_N,j) from the measured voltages (U_L1 L2,GD; U_MN) for each switching pattern of the switching contacts (SW_Li,j; SW_N,j).

13. The photovoltaic inverter (1) according to claim 8, wherein a warning device (19) is provided for outputting an error message if a lack of functionality of a switching contact (SW_Lx,j) of the disconnection point (12) is detected.

14. The photovoltaic inverter (1) according to claim 8, wherein a device (20) is provided for limiting the current (I_Lx) through each line (Lx) in the testing mode.

15. The photovoltaic inverter (1) according to claim 8, wherein the first switching contacts (SW_Lx,1) of all lines (Lx) of the disconnection point (12) are formed by at least one multi-pole relay (22) and the second switching contacts (SW_Lx,2) of all lines (Lx) of the disconnection point (12) are formed by at least one further multi-pole relay (23).

* * * * *

UNITED STATES PATENT AND TRADEMARK OFFICE
CERTIFICATE OF CORRECTION

Page 1 of 1

PATENT NO. : 11,125,833 B1
APPLICATION NO. : 17/274245
DATED : September 21, 2021
INVENTOR(S) : Gerhard Wallisch et al.

It is certified that error appears in the above-identified patent and that said Letters Patent is hereby corrected as shown below:

In the Claims

In Claim 1, (Column 11, Line 2): before "disconnection point" add --of the--

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*